(12) United States Patent
Zimmermann et al.

(10) Patent No.: US 12,219,729 B2
(45) Date of Patent: Feb. 4, 2025

(54) UNIVERSAL SERIAL BUS (USB) PORT CONTROL

(71) Applicant: ZPE Systems, Inc., Fremont, CA (US)

(72) Inventors: Arnaldo Zimmermann, Dublin, CA (US); Livio Ceci, Fremont, CA (US)

(73) Assignee: ZPE SYSTEMS, INC., Singapore (SG)

( * ) Notice: Subject to any disclaimer, the term of this patent is extended or adjusted under 35 U.S.C. 154(b) by 441 days.

(21) Appl. No.: 17/713,249

(22) Filed: Apr. 5, 2022

(65) Prior Publication Data

US 2022/0232724 A1  Jul. 21, 2022

Related U.S. Application Data

(63) Continuation-in-part of application No. 16/813,652, filed on Mar. 9, 2020, now Pat. No. 11,337,323,
(Continued)

(51) Int. Cl.
| | | |
|---|---|---|
| H05K 7/14 | (2006.01) |
| G06F 13/42 | (2006.01) |
| H01R 24/64 | (2011.01) |
| H04L 41/00 | (2022.01) |
| H04L 41/0806 | (2022.01) |
| H04L 41/0893 | (2022.01) |

(Continued)

(52) U.S. Cl.
CPC ....... *H05K 7/1487* (2013.01); *G06F 13/4282* (2013.01); *H01R 24/64* (2013.01); *H04L 41/0806* (2013.01); *H04L 41/0893* (2013.01); *H04L 69/16* (2013.01); *H05K 5/0204* (2013.01); *H05K 5/0247* (2013.01); *H05K 5/03* (2013.01); *H04L 41/24* (2013.01); *H04L 43/04* (2013.01)

(58) Field of Classification Search
CPC .. H05K 7/1487; H05K 5/0204; H05K 5/0247; H05K 5/03; G06F 13/4282; H01R 24/64; H04L 41/0806; H04L 41/0893; H04L 69/16; H04L 41/24; H04L 43/04
See application file for complete search history.

(56) References Cited

U.S. PATENT DOCUMENTS 7,689,675 B2 *  3/2010  Tucker ............... H04L 41/12
                                                    713/100
8,549,337 B2 * 10/2013  Odaguchi ........... G06F 1/3253
                                                    713/320
(Continued)

*Primary Examiner* — Ninos Donabed
(74) *Attorney, Agent, or Firm* — HORIZON IP PTE LTD.

(57) ABSTRACT

A control system for individually controlling one or more universal serial bus (USB) ports. The control system may include at least one USB interface that provides at least one USB port, at least one power control unit in communication with the at least one USB interface, and one or more non-transitory computer-readable media for storing computer-readable program code and a configuration dataset. The control system may further include a processor device in communication with the one or more non-transitory computer-readable media, the at least one power control unit and the at least one USB interface. The processor device may be operative with the computer-readable program code to retrieve configuration data from the configuration dataset and control power supply to the at least one USB port in accordance with the configuration data by enabling or disabling the at least one power control unit.

18 Claims, 8 Drawing Sheets

Related U.S. Application Data which is a continuation-in-part of application No. 15/933,399, filed on Mar. 23, 2018, now Pat. No. 10,622,769, which is a continuation-in-part of application No. 15/872,952, filed on Jan. 16, 2018, now Pat. No. 10,530,105, which is a continuation of application No. 15/862,582, filed on Jan. 4, 2018, now Pat. No. 10,164,385, which is a continuation of application No. 15/372,134, filed on Dec. 7, 2016, now Pat. No. 9,905,980, which is a continuation of application No. 15/063,838, filed on Mar. 8, 2016, now Pat. No. 10,418,762.

(60) Provisional application No. 63/186,766, filed on May 10, 2021, provisional application No. 62/144,870, filed on Apr. 8, 2015, provisional application No. 62/130,491, filed on Mar. 9, 2015.

(51) Int. Cl.
  *H04L 43/04* (2022.01)
  *H04L 69/16* (2022.01)
  *H05K 5/02* (2006.01)
  *H05K 5/03* (2006.01)

(56) References Cited

U.S. PATENT DOCUMENTS

| | | | |
|---|---|---|---|
| 9,325,577 B2 * | 4/2016 | Cox | H04L 41/0843 |
| 10,845,857 B2 * | 11/2020 | Ng | G06F 1/266 |
| 2006/0242271 A1 * | 10/2006 | Tucker | H04L 41/08 709/220 |
| 2006/0242401 A1 * | 10/2006 | Elliger | H04L 63/0236 713/2 |
| 2007/0038739 A1 * | 2/2007 | Tucker | H04L 41/12 709/224 |
| 2009/0172208 A1 * | 7/2009 | Lee | G06F 1/266 710/13 |
| 2009/0210734 A1 * | 8/2009 | Schramm | G06F 13/385 713/324 |
| 2013/0234668 A1 * | 9/2013 | Kuo | G06F 1/266 320/125 |
| 2013/0268789 A1 * | 10/2013 | Yang | G06F 1/3287 713/323 |
| 2015/0188763 A1 * | 7/2015 | Cox | H04Q 1/13 709/220 |
| 2017/0308374 A1 * | 10/2017 | Tian | G06F 9/445 |
| 2017/0338665 A1 * | 11/2017 | Long | H02J 7/0013 |
| 2018/0231946 A1 * | 8/2018 | Savo | G05B 19/4185 |
| 2020/0242064 A1 * | 7/2020 | Li | G09G 5/006 |

* cited by examiner

| Port (702a) | Path (704a) | Port (702b) | Path (704b) |
| --- | --- | --- | --- |
| 1 | 1.1.1.1 | 17 | 2.1.1.1 |
| 2 | 1.1.1.2 | 18 | 2.1.1.2 |
| 3 | 1.1.1.3 | 19 | 2.1.1.3 |
| 4 | 1.1.1.4 | 20 | 2.1.1.4 |
| 5 | 1.1.2 | 21 | 2.1.2 |
| 6 | 1.1.3 | 22 | 2.1.3 |
| 7 | 1.1.4 | 23 | 2.1.4 |
| 8 | 1.2.1 | 24 | 2.2.1 |
| 9 | 1.2.2 | 25 | 2.2.2 |
| 10 | 1.2.3 | 26 | 2.2.3 |
| 11 | 1.2.4 | 27 | 2.2.4 |
| 12 | 1.3.1 | 28 | 2.3.1 |
| 13 | 1.3.2 | 29 | 2.3.2 |
| 14 | 1.3.3 | 30 | 2.3.3 |
| 15 | 1.3.4 | 31 | 2.3.4 |
| 16 | 1.4 | 32 | 2.4 |

UNIVERSAL SERIAL BUS (USB) PORT CONTROL

CROSS-REFERENCE TO RELATED APPLICATIONS

This application claims the benefit of U.S. Provisional Application No. 63/186,766, filed May 10, 2021, entitled "Universal Serial Bus (USB) Port Management Framework", and is also a continuation-in-part of prior U.S. patent application Ser. No. 16/813,652, filed Mar. 9, 2020, which is a continuation-in-part of prior U.S. patent application Ser. No. 15/933,399, filed Mar. 23, 2018, which is a continuation-in-part of prior U.S. patent application Ser. No. 15/872,952, filed Jan. 16, 2018, which is a continuation of prior U.S. patent application Ser. No. 15/862,582, filed on Jan. 4, 2018, which is a continuation of prior U.S. patent application Ser. No. 15/372,134, filed Dec. 7, 2016, which is a continuation of prior U.S. patent application Ser. No. 15/063,838, filed Mar. 8, 2016, which claims the benefit of U.S. Provisional Application No. 62/130,491, filed Mar. 9, 2015, entitled "High Serial Port Count Infrastructure management system," and U.S. Provisional Application No. 62/144,870, filed Apr. 8, 2015, entitled "High Serial Port Count Infrastructure management system," which are all hereby incorporated by reference in their entirety.

BACKGROUND

In data centers, the concentration of Information Technology ("IT") devices (e.g. virtual devices instantiated in combination with physical computing hardware and software such as: compute nodes, networking nodes, storage nodes, power nodes, and/or cooling nodes) may create a data center environment with significant overhead in tracking, configuring, clustering and managing IT device state(s). The IT devices may also have a multitude of interfaces, which may require a multitude of different IT device concentrator hardware units to physically connect to the IT devices. In some other data center environments, collocation environment or edge of the network point-of-presence may deploy a flexible number of same kinds of IT devices or a flexible number of different kinds of IT devices, which may create a challenge on planning the right multitude of different IT device concentrator hardware units to physically connect to the IT devices. Some of the various techniques to work in such a cluttered environment may require a combination of device search tools, multiple IT device concentrator hardware units, management tools and/or many more additional supporting tools.

Additionally, various IT devices, such as IT devices by various vendors, may have different communication interfaces, network protocols, functions, user interfaces and application programmable interfaces (APIs), which may increase the difficulty of communicating with IT device(s). Deploying multiple devices, setting up consistent configurations and adding network functions on new or existing infrastructures is very time consuming and tedious. Networking teams typically spend a long-time during evaluation, especially when numerous appliances are required.

BRIEF DESCRIPTION OF THE DRAWINGS

FIG. 7 shows an exemplary table; and

DETAILED DESCRIPTION

Figure 1:
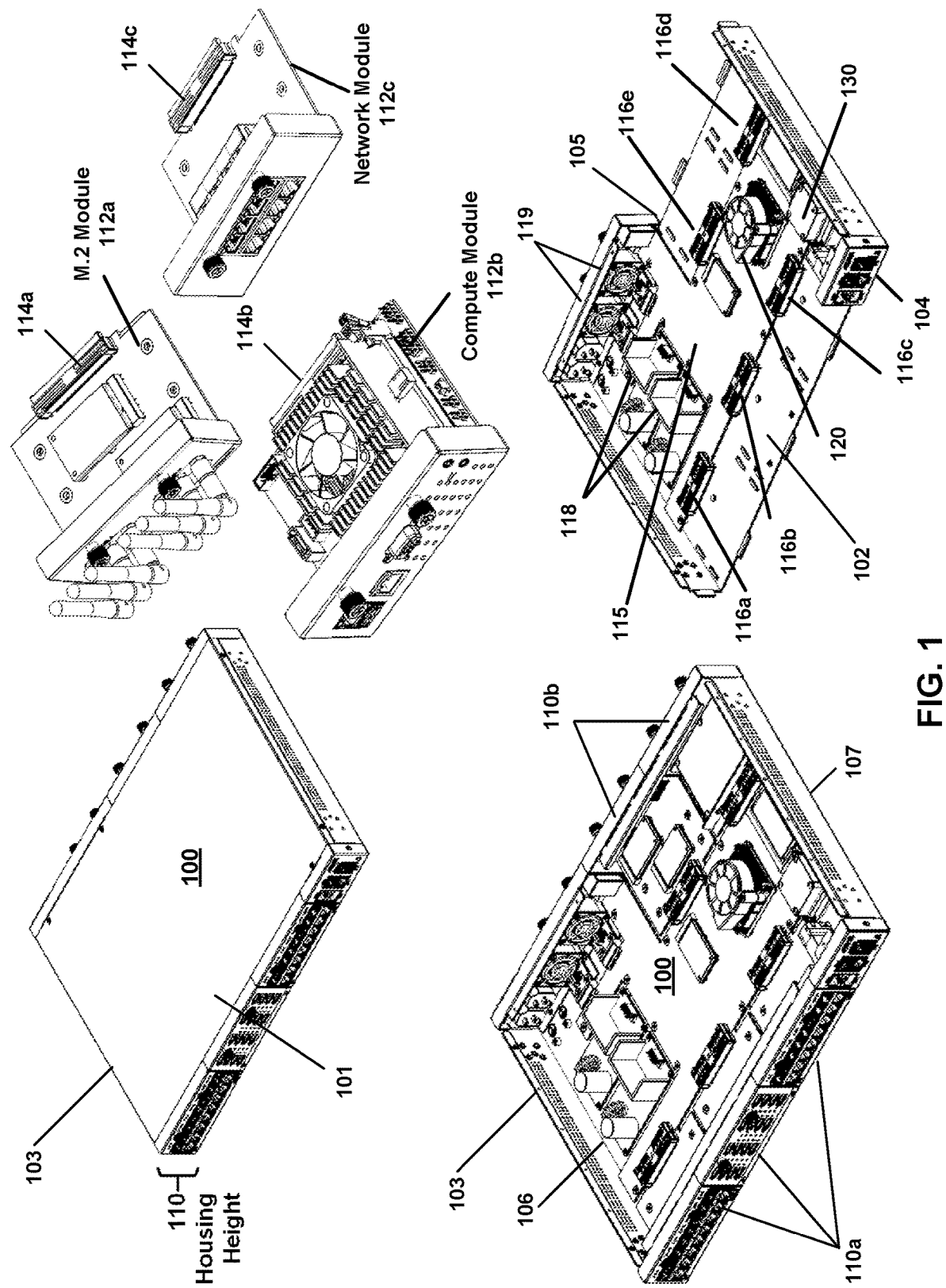
FIG. 1 illustrates various views of an exemplary infrastructure management system.

Some of the various embodiments of the present invention relate to infrastructure management systems, and more particularly to a data center infrastructure management system(s) configured to process network communication of data center component(s). Various embodiments relate to a data center infrastructure configured to process network communication from data center component(s) (e.g. IT devices) and employ the device information to determine an action to be performed on data center component(s) in an infrastructure management system.

A device is a machine and/or component that may attach to a computer and/or computer network. Examples of devices include disk drives, printers, displays, mice, and modems. These particular devices may fall into a category of peripheral devices separate from a main computing device. Other example devices may be non-peripheral devices such as IT devices. Many devices, whether peripheral or not, may employ a program called a device driver that may act as a translator, converting general commands from an application into specific commands that the device understands.

An IT device is an "Information Technology" device related to computing technology, comprising, but not limited to: data center devices, networking devices, hardware devices, software operating in combination with a hardware IT device, Internet devices, and/or the like. Some IT devices may employ virtual devices operating on specially configured hardware. Additional examples of IT devices include servers, compute nodes, routers, switches, firewalls, load balancers, networking nodes, storage nodes, power nodes, cooling nodes, storage appliances, power appliances, cooling appliances, network appliances, virtual appliances, virtual machines, system hardware with network access, hosted module within a system, combinations thereof, and/or the like. Other IT devices may include devices that consume power from a communication port (e.g., USB port), such as an alarm, light, fan, speaker, or other devices without a logical function.

A virtual device may employ a software virtual device driver operating on a hardware computing device configured to emulate hardware and/or other devices so that multiple applications may, for example, access hardware interrupt channels, hardware resources and memory without causing conflicts. Computer hardware may require communication and control processes for devices and/or hardware components to access each other in a controlled manner. These processes may be defined as device drivers, which may comprise code that an application may employ to access hardware and/or external software resources. Some examples of virtual devices may be configured for use in multitasking operating systems. In such an example, a device driver may be controlled by an operating system's virtual device driver manager and shared by applications running within that kernel. A virtual device driver may pass interrupt and memory requests through the kernel, which in turn may allocate resources as required.

An agent may comprise a computer program that acts for a user or other program in a relationship of agency, which derives from the Latin agere (to do): an agreement to act on one's behalf. Such "action on behalf" of implies the authority to decide which, if any, action is appropriate. Some agents may comprise, but are not limited to: intelligent agents (in particular exhibiting some aspect of artificial intelligence, such as learning and reasoning), autonomous agents (capable of modifying the way in which the agent achieves objectives), distributed agents (being executed on physically distinct computers), multi-agent systems (distributed agents that do not have the capabilities to achieve an objective alone and thus must communicate), mobile agents (agents that can relocate their execution onto different processors), and/or the like.

Some of the various embodiments may communicate with virtual (in combination with configured hardware) and/or physical IT devices such as compute nodes, networking nodes, storage nodes, power nodes, cooling nodes, other IT devices, combinations thereof, and/or the like. An infrastructure management system may automatically perform an action on IT device(s)—based at least in part, by an IT device information.

The nature of the interaction between infrastructure management system(s) and IT device(s) may be regulated by the type of device itself to dictate network protocols natively supported by the IT device(s). The type of IT device(s) may also be used to identify a class or type of action that may apply for IT device(s) available in a network.

Traditionally, when an IT device is connected to a controller, it is usually assigned a sequential (or sometimes random) identifier (ID) or logical device name. For example, the universal serial bus (USB) driver creates a device name in the format /dev/usbN where N is a sequential number (e.g. ./dev/usb0). When the device is removed and reconnected, a new number is typically assigned (e.g. /dev/usb1). In the case of multiple USB ports available, the sequential number still applies, regardless of the port or the order that the device is connected to. With this approach, there is no relationship between a physical port and a logical device name.

One aspect of the present framework individually maps the communication ports (e.g., USB ports) to unique logical device names. A deterministic logical device name may be linked to a given communication port to provide a persistent reference. This feature allows a physical communication port to be mapped internally in the operating system (OS) to a unique logical device name regardless of the logical position on the device tree. The unique logical device name may be preserved when the IT device is inserted and removed, allowing the association to be used to map the physical port to the same resource. This allows for security enforcement and an association between the logical device and resource.

In accordance with another aspect of the present framework, the power applied to USB ports is individually controlled. A power control circuit and software application may be provided to enable or disable power applied to individual USB ports. The power applied to a USB port may be enabled to function as a power outlet or disabled to prevent power-related damage. These and other exemplary features and advantages will be provided in more details herein.

FIG. 1 illustrates various views of an exemplary infrastructure management system 100. In some implementations, the infrastructure management system 100 is modular (i.e., provide modular slots that receive communication card modules). A non-modular infrastructure management device (e.g., USB hub) may also be provided. The height 110 of the housing 103 for the infrastructure management system 100 may be one Rack-Unit (1 U) while mounted horizontally to the rack, less than one Rack-Unit (<1 U) while mounted horizontally to the rack, or zero Rack-Unit (0 U) while mounted vertically to the rack. The housing 103 may be configured to enclose one or more communication card modules 112a-c and a circuit board 115 having one or more processor devices, one or more planes for data and control, one or more non-transitory tangible machine-readable media, other semiconductor chips and/or components mounted thereon.

The housing 103 includes a cover plate 101 and a base plate 102. The base plate may include first edge 104 and second edge 105 that are parallel to each other, as well as third edge 106 and fourth edge 107 that are parallel to each other. The third edge 106 and fourth edge 107 are parallel and perpendicular to the first edge 104 and second edge 105. First modular slots 110a are disposed along the first edge 104 and second modular slots 110b are disposed along second edge 105. The term "slot" is used herein to refer to a receptacle or void in the housing 103 for receiving a communication card module 112a-c. Each slot does not have e.g., a frame defined by the housing 103 (i.e., frameless). The modular slots 110a-b are interchangeable and may share a common width. As shown in FIG. 1, three modular slots 110a are disposed along the first edge 104 and two modular slots 110b are disposed along the second edge 105. It should be appreciated that other configurations, such as three or more modular slots disposed along each edge, are also possible. Alternatively, modular slots may be disposed along only one of either first or second edges of the housing. The modular slots 110a-b are configured to removably receive at least one communication card module 112a-c. It should be also appreciated that a single communication card module may take half, one, two or more modular slots depending on the width of the communication card module, which may be equivalent to half, one, two, three modular slots width. A cover plate of the size of one or more slots may be used to cover a modular slot when it is not in use.

A circuit board 115 is disposed on, and is parallel to, the base plate 102 of the housing 103. The circuit board 115 is electrically coupled to the communication card modules 112a-c via connectors 116a-e. A connector 116a-e is provided for each modular slot 110a-b along an edge of the circuit board 115 for electrically contacting an edge contact 114a-c of a communication card module 112a-c. The circuit board 115 may hold other components, such as a processor device or central processing unit (CPU) 120, a network switch 130, a data plane and a network plane. Other components, such as an input/output (I/O) interface unit, power control unit, fan, additional peripheral controller(s) related to the I/O interface units, one or more non-transitory computer-readable media (e.g., system memory) and common peripherals, or other semiconductor chips, may also be mounted on the circuit board 115. For example, the circuit board 115 may further include one or more network interfaces, a console port, one or more USB ports, a graphical port, a data storage device and/or other components. The housing 103 may also include one or more power supplies 118, one or more fans 119, and/or one or more power plugs for alternating current (AC) or direct current (DC) feeds.

The connectors 116a-e may be advantageously mechanically and electrically designed to avoid short circuits or burning to the user errors (e.g., fitting into the wrong slots). Each connector 116a-e may provide a common interface for the communication card modules 112a-c. In some implementations, the pins in the same positions of the connectors 116a-e are assigned the same functions (or signals), regardless of whether the functions are used by the respective communication card module 112a-c or not. For example, the connectors 116a-e may be implemented as 120-pin connectors following the same pin position and signal assignments for different power voltage signals, ground signals, data signals for a data bus or data plane, control signals for a control bus or control plane, regardless of whether they are electrically connected or not. Any pin that may not be in use by the communication card modules 112a-c may be electrically disconnected and physically connected with the communication card modules 112a-c.

Figure 2:
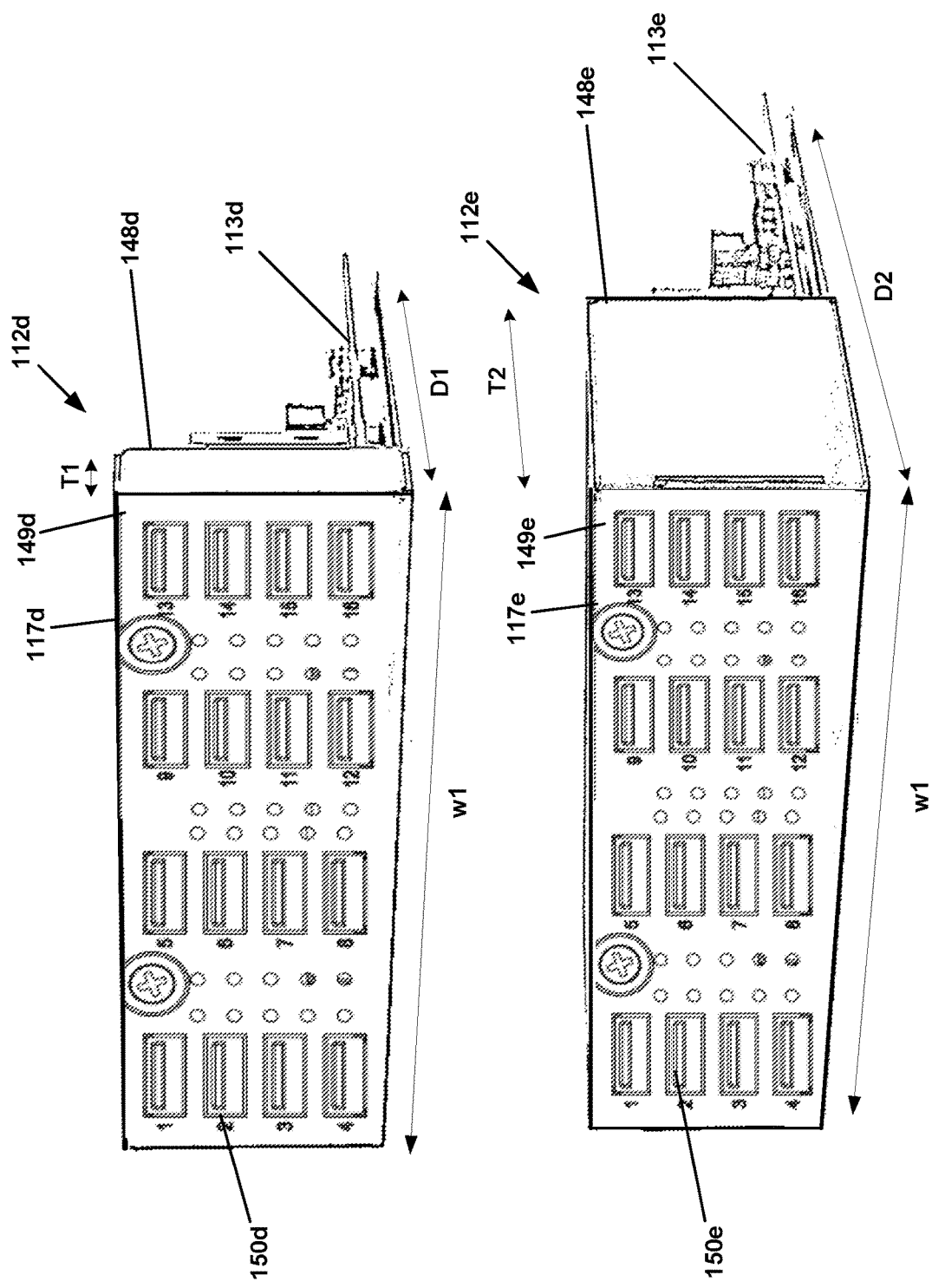
FIG. 2 shows exemplary first and second communication card modules.

FIG. 2 shows exemplary first and second communication card modules 112d-e. Communication card modules 112d-e may be removably inserted into any half, one or more (e.g., 1.5, 2, 3 or more) modular slots 110a-b, similar to communication card modules 112a-c shown in FIG. 1. Each communication card module 112 d-e includes a circuit board 113d-e having one or more semiconductor chips. The circuit board 113d-e has first and second parallel edges, and third and fourth parallel edges perpendicular to the first and second edges.

A face plate 117d-e is disposed along the first edge and perpendicular to the circuit board 113d-e, and an edge contact (not shown) is disposed along the second edge. The face plate 117d-e has an inner surface 148d-e and an outer surface 149d-e, wherein the inner and outer surfaces (148d-e, 149d-e) are parallel to each other. When the communication card module 112d-e is removably inserted into one or more first modular slots 110a, the inner surface 148d-e is aligned along and flush against (or directly adjacent to) the first edge 104 of the housing 103, with the circuit board 113d-e parallel to the base plate 102 of the housing 103 and the edge contact electrically contacting the corresponding connector 116a-c on the circuit board 115. Since the one or more first modular slots 110a are frameless, the face plate 117d-e of the communication card module 112d-e covers the entire width of the one or more first modular slots 110a and the outer surface 149d-e of the communication card module 112d-e defines an exterior surface of the modular infrastructure management system 100.

In some implementations, the width ($w_1$) of the face plate 117d-e of each communication card module 112d-e is a multiple (n) of the width ($w_2$) of a modular slot 110a-b (i.e., $w_1 = nw_2$, where n is an integer). For example, a power modular card with nine power outlets may occupy two modular slots. It may be advantageously more cost effective to make one card instead of two individual cards to provide the same number of power outlets to fit into two modular slots. In another example, it may be advantageously more cost effective to make a single communication card that occupies three modular slots in order to house 48 RJ45 serial ports on one single circuit board, instead of three communication cards of 16 RJ45 serial ports each. Additionally, by providing communication card modules that are removably insertable into the infrastructure management system 100, the infrastructure is advantageously dynamically scalable to the needs and requirements of the network system.

The distance between the inner surface 148d-e and the outer surface 149d-e defines the thickness (T1 or T2) of the face plate 117d-e. In some implementations, the face plates 117d-e of the communication card modules 112d-e have different thicknesses (T1, T2). For example, the thickness T1 of the first communication card module 112d is less than the thickness T2 of the second communication card module 112e. Advantageously, the frameless first and second modular slots 110a-b can accommodate communication card modules 112d-e with different depths (D1, D2) that may be designed to adjust for future communication card module requirements.

The face plate 117d-e may include, for example, one or more communication interfaces 150d-e for providing one or more connections between the infrastructure management system 100 and one or more external devices. The one or more communication interfaces 150d-e may include one or more universal serial bus (USB) ports. Other types of ports, such as one or more null-modem serial ports; one or more Data Communications Equipment (DCE) serial ports; one or more Data Terminal Equipment (DTE) serial ports; one or more Cisco pinout serial ports; one or more Cyclades pinout serial ports; one or more straight-through serial ports; one or more cross-over serial ports; one or more RJ45 ports; one or more RS-232 serial ports; one or more RS-485 serial ports; one or more serial ports; one or more Local Area Network (LAN) ports; one or more Wide Area Network (WAN) ports; one or more Wi-Fi wireless Network ports; one or more input-output (I/O) ports, one or more Ethernet ports (e.g., gigabit Ethernet or GbE ports, copper, Power over Ethernet or PoE+, small form factor pluggable or SFP/SFP+, etc.), cellular, a combination of the above and/or the like, are also possible.

The communication card modules 112 may be removably inserted into the modular slots 110a-b to provide one or more desired functionalities to the infrastructure management system 100. The desired functionalities may include, but are not limited to, one or more communication interfaces, network adapter (e.g., Local Area Network or LAN, Wide Area Network or WAN, Virtual Private Network or VPN, Wi-Fi, wireless WAN, Bluetooth™), storage (e.g., solid-state drive, dynamic random access memory, static random access memory, hard drive), cellular connectivity, satellite navigation, near field communication (NFC), digital radio, Wireless Gigabit Alliance (WiGig), power, compute functions, outlet functions, keyboard-video-mouse (KVM) switch, or a combination thereof.

The communication card modules 112 may include the necessary logic for functioning according to a respective standard specification, such as the M.2 (or Next Generation Form Factor), mSATA, Personal Computer Memory Card International Association (PCMCIA), and so forth. For example, an M.2 module 112a, a compute module 112b and an 8-port gigabit Ethernet (GbE) network module 112c are shown in FIG. 1, while a 16-port USB module 112d and a 16-port USB module 112e are shown in FIG. 2. It should be appreciated that other types of communication card modules may also be provided, as for example, demonstrated on FIG. 2.

The modular infrastructure management system 100 and removable communication card modules 112 allow the user to select the desired functionality by removably inserting respective communication card modules 112 in each of the modular slots 110a-b. If the user desires a different functionality, the user may simply remove a communication card module 112 from a modular slot 110a-b in the modular infrastructure management system 100 and insert a different communication card module 112. It should be appreciated that an Operating System (OS) may automatically identify the type of communication card module that is attached and may provide options to configure the different communication card modules.

Figure 3:
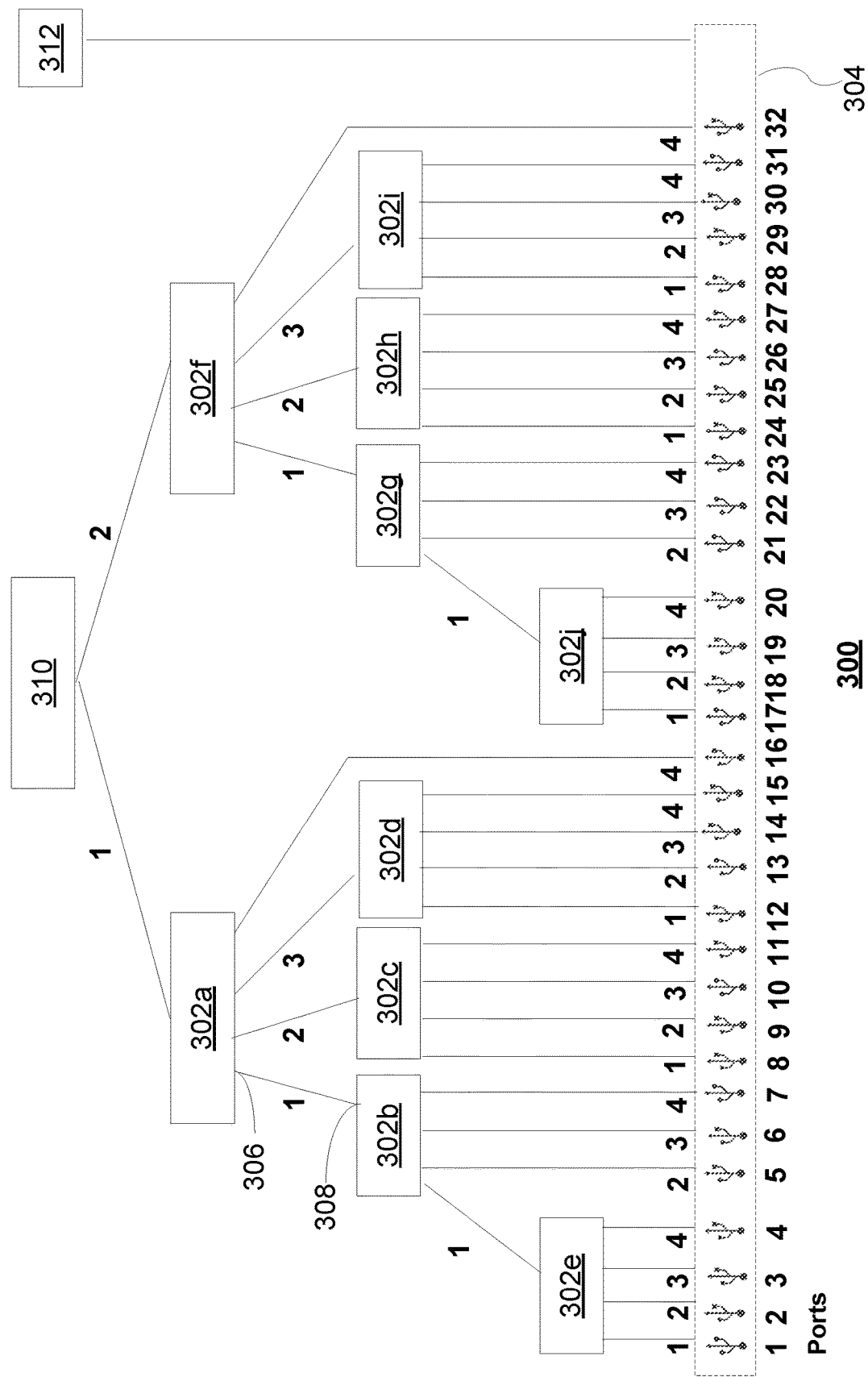
FIG. 3 illustrates an exemplary device tree.

FIG. 3 illustrates an exemplary device tree 300. Device tree 300 is a hierarchical data structure that contains information about the arrangement of USB modules 112d-e and/or external USB hubs coupled to the infrastructure management system 100. A USB hub is an external interface device that expands one USB port on the infrastructure management system 100 into multiple independent USB ports and enables these multiple USB ports to connect to multiple devices at the same time Multiple nodes 302a-j may be cascaded to provide multiple USB ports 304. Nodes 302a-j may represent USB modules 112d-e, USB hubs or a combination thereof. Although each node 302a-j is shown to provide four USB ports, any other number of USB ports or other types of communication ports may also be provided. Nodes 302a-j are cascaded by communicatively coupling a USB port 306 of a node (e.g., 302a) to a USB port 308 of another node (e.g., 302b). For purposes of illustration, ten nodes 302a-j are cascaded to provide thirty-two USB ports 304, with each node providing four USB ports. Other number of nodes and/or USB ports, or other types of communication ports, may also be provided.

Each USB port 304 may be individually configured and controlled by a device driver 310 and a control application 312 implemented within the operating system (OS). In some implementations, device driver 310 builds device tree 300 when the system boots. Device tree 300 may be dynamic. As connections are added to, or removed from, the infrastructure management system 100, device driver 310 updates the device tree 300. Each connection between the nodes 302a-j may be represented by an identifier, such as a numerical identifier (e.g., 1, 2, 3, 4). A path from the device driver 310 to the USB port where an IT device is coupled to may be referred to as a device path of the IT device.

Figure 4:
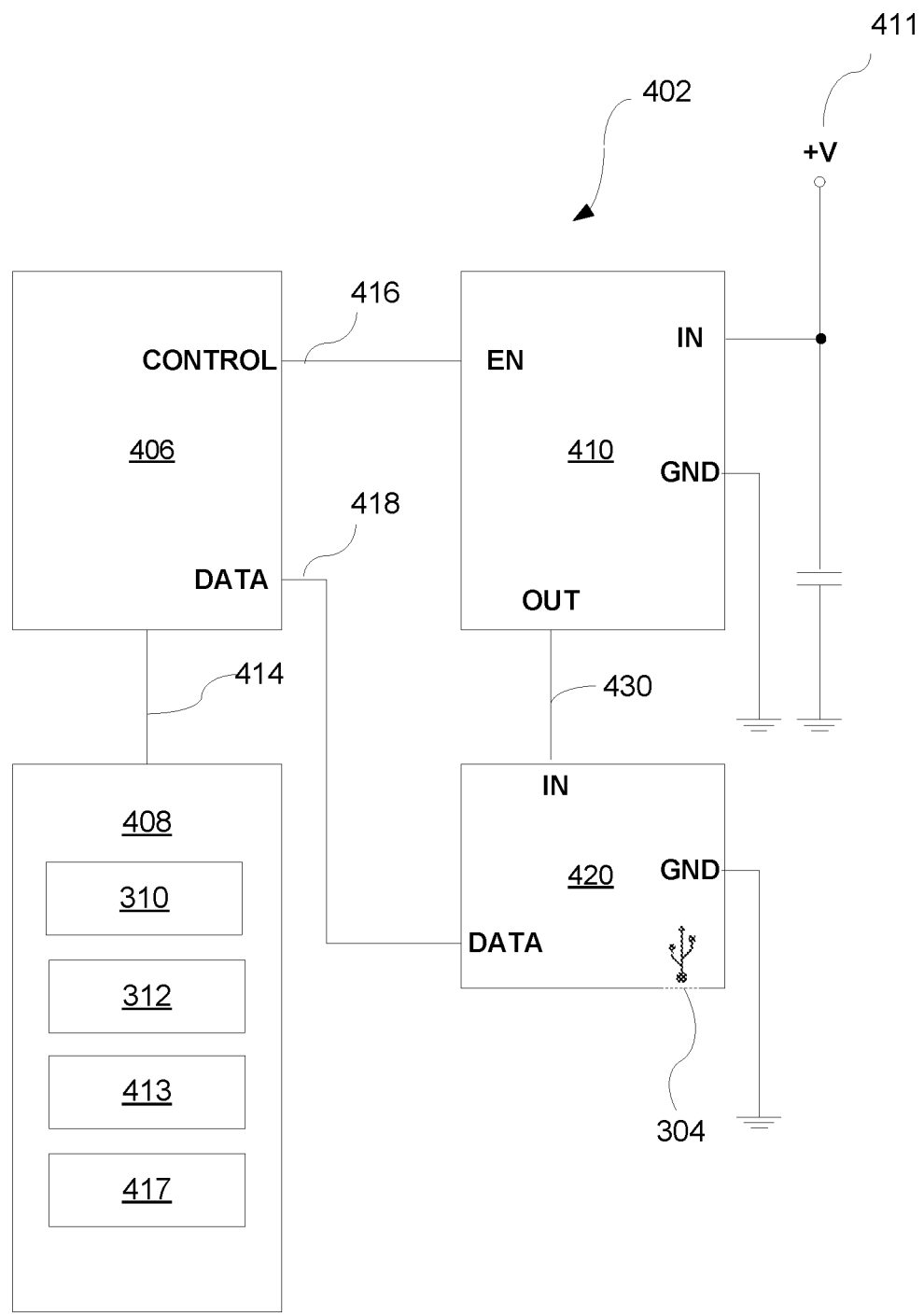
FIG. 4 shows an exemplary control system for individually controlling one or more universal serial bus (USB) ports.

FIG. 4 shows an exemplary control system 402 for individually controlling one or more USB ports 304. In some implementations, control system 402 includes a processor device 406 coupled to one or more non-transitory computer-readable media 408 (e.g., memory device), power control unit 410 and USB interface 420. Control system 402 may further include support circuits such as a cache, clock circuits and a communications bus. Various other peripheral devices, such as additional data storage devices and IT devices, may also be connected to the control system 402. Exemplary control system 402 may be implemented in an infrastructure management system (e.g., modular infrastructure management system, USB hub). For example, the processor device 406, one or more non-transitory computer-readable media 408 and power control unit 410 may be implemented on circuit board 115 disposed on the base plate 102 of the housing 103 of the infrastructure management system illustrated in FIG. 1. USB interface 420 may be provided by, for example, communication card module 112.

The present technology may be implemented in various forms of hardware, software, firmware, special purpose processors, or a combination thereof, either as part of the microinstruction code or as part of an application program, device driver or software product, or a combination thereof, which is executed via the operating system (OS). In some implementations, the techniques described herein are implemented as computer-readable program code tangibly embodied in one or more non-transitory computer-readable media 408. In particular, the present techniques may be implemented by a device driver 310, a control application 312 and a configuration engine 413. Device driver 310, control application 312 and configuration engine 413 may be implemented as part of the operating system (OS). Non-transitory computer-readable media 408 may further include a configuration dataset 417.

Device driver 310 enables an IT device to communicate with the OS via a USB port. Control application 312 is a component of the OS that serves as a device manager to allow viewing and management of IT devices installed in control system 402. Configuration engine 413 may generate an interface to configure and/or manage control system 402. The interface may comprise a user interface which may be available via, for example, a command line interface (CLI), a web interface, programmatically via an application programmable interface (API), a combination thereof, and/or the like. Configuration engine 413 may generate, store, read and/or update configuration data in configuration dataset 417. The configuration data may include power enablement information, port mapping information, or a combination thereof. The power enablement information may comprise, for example, power enablement parameters and power states for individual ports. The port mapping information may include, for example, logical device names, port names, mapping of ports to device paths, mapping of port names to ports, mapping of port names to logical device names, or a combination thereof.

Non-transitory computer-readable media 408 is communicatively coupled to processor device 406 via a data bus 414. Non-transitory computer-readable media 408 may include random access memory (RAM), read-only memory (ROM), magnetic floppy disk, flash memory, an in-memory data store, an on-disk data store, a local data store, a remote data store, a distributed data store, a replicated data store, other types of memories, or a combination thereof. The computer-readable program code is executed by processor device 406 to process data provided by, for example, configuration dataset 417. The computer-readable program code is not intended to be limited to any particular programming language and implementation thereof. It will be appreciated that a variety of programming languages and coding thereof may be used to implement the teachings of the disclosure contained herein.

USB interface 420 includes one or more USB ports 304 for providing one or more connections between the control system 402 and one or more external IT devices. USB interface 420 receives data from the processor device 406 via data line 418. In some implementations, power supplied to the one or more USB ports 304 may be individually controlled by power control unit 410, device driver 310 and control application 312.

Power control unit 410 is coupled to processor device 406 via a control line 416. Power control unit 410 is further coupled to the USB interface 420 via power line 430 to provide power to the USB port 304. Although only one power control unit 410 and one USB interface 420 are shown, it should be appreciated that multiple power control units 410 may be provided to supply power to multiple USB interfaces 420. One power control unit 410 may be coupled to one corresponding USB interface 420. Multiple power control units 410 may be coupled to the processor device 406 via multiple control lines 416. Each control line 416 may control one or more power control units 410.

The initial state of power for the USB port 304 may be defined by the control system 402, until control application 312 determines the new power state based on the power enablement information. The control system 402 may define the initial state of the USB port 304 as disabled, so no power is applied to the USB port 304 and to any IT device coupled to the USB port 304 until the control application 312 determines the power state based on the power enablement information. Control application 312 may cause the processor device 406 to enable the power control unit 410 via control line 416. Upon enablement by processor device 406, power control unit 410 supplies power from the power source 411 to the USB interface 420 via power line 430. When control application 312 causes the processor device 406 to disable the power control unit 410 via control line 416, power control unit 410 disconnects the power supplied by power source 411 via power line 430.

It is to be further understood that, because some of the constituent system components and method steps depicted in the accompanying figures can be implemented in software, the actual connections between the systems components (or the process steps) may differ depending upon the manner in which the present framework is programmed. Given the teachings provided herein, one of ordinary skill in the related art will be able to contemplate these and similar implementations or configurations of the present framework.

Figure 5:
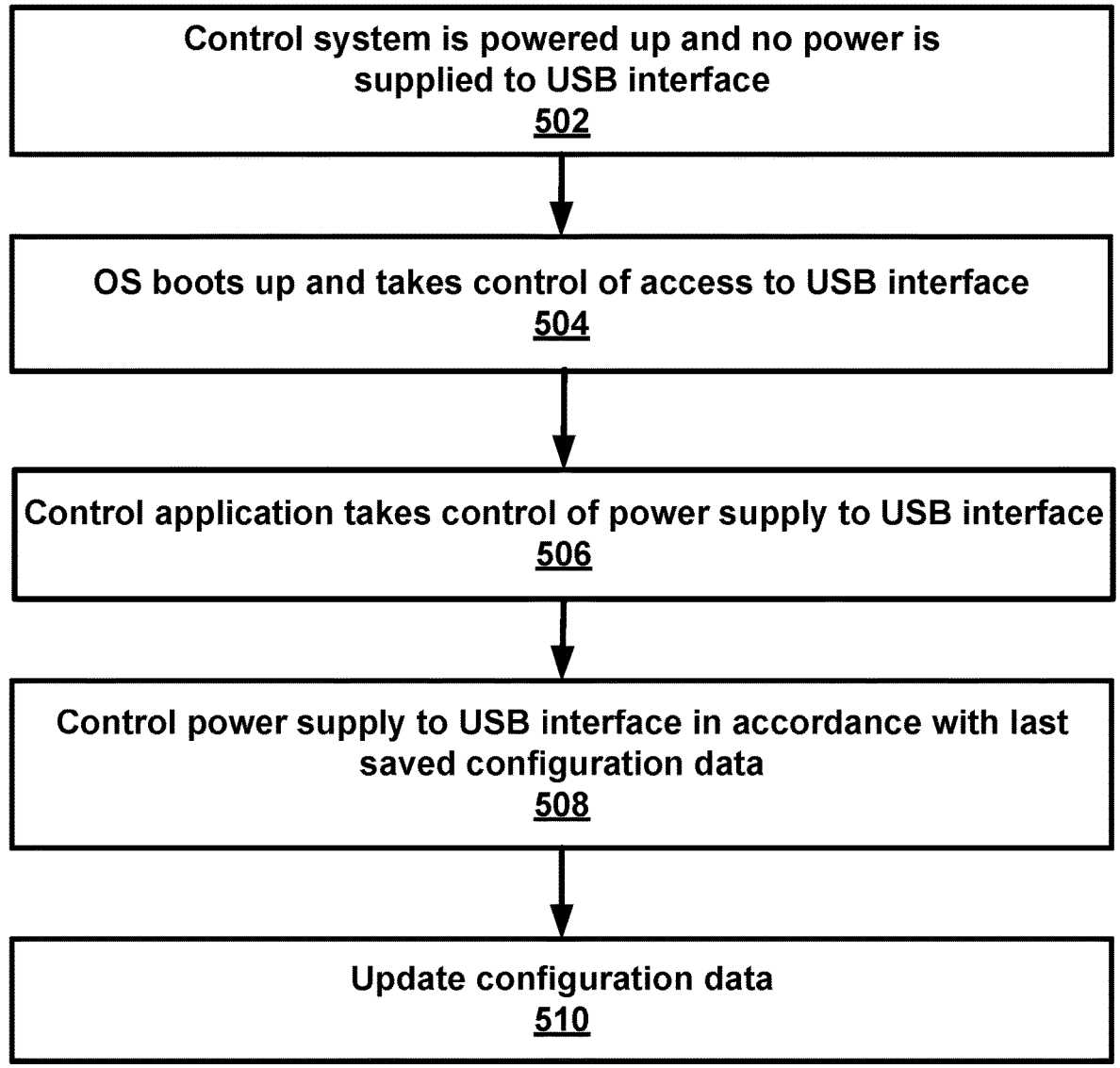
FIG. 5 shows an exemplary method of controlling power supply.

FIG. 5 shows an exemplary method 500 of controlling power supply. It should be understood that the steps of the method 500 may be performed in the order shown or a different order. Additional, different, or fewer steps may also be provided. Further, the method 500 may be implemented with the infrastructure management system as illustrated in FIGS. 1-3, control system 402 as illustrated in FIG. 4, a different system, or a combination thereof.

At 502, when control system 402 is first powered up, no power from the power source 411 is supplied to the USB interface 420. Power control unit 410 may be disabled upon power up, so power from the power source 411 is not supplied to the USB interface 420, including the USB port 304.

At 504, the operating system (OS) boots up and takes control of access to the USB interface 420, including the USB port 304. No external device may be detected as being coupled to the USB interface 420.

At 506, control application 312 within the OS takes control of power supply to the USB interface 420 via power control unit 410.

At 508, control application 312 controls power supply to the USB interface 420 including a USB port 304 in accordance with the configuration data. Control application 312 may retrieve configuration data last saved in configuration dataset 417. The configuration data may include power enablement parameters for individual USB ports 304. For example, the power enablement parameters may specify that power supply is to be enabled for one or more individual USB ports (e.g., ports 1, 2, . . . ) and power supply is to be disabled for one or more individual USB ports (e.g., ports 5, 6, . . . ). Based on the power enablement parameters, control application 312 may enable or disable power supply to individual USB ports 304 via the power control units 410 associated with the respective USB interfaces 420. Enabling power supply to a USB port 304 advantageously allows the port to function as a power outlet, while disabling power supply to the USB port 304 prevents any power-related damage or incident.

At 510, control application 312 updates configuration data. Configuration data may be updated via configuration engine 413. For example, configuration engine 413 may present a user interface to accept user configuration of power enablement parameters for individual USB ports 304. Configuration engine 413 may also accept automatic system configuration of the power enablement parameters. Control application 312 may further update current power states, which indicate whether the power is currently enabled or disabled for the individual USB ports 304.

In some implementations, device driver 310 detects an IT device that is coupled to a USB port 304 with power enabled. Alternatively, the IT device may consume power from the USB port 304 without being installed or detected by device driver 310. Such IT devices may include, for example, a fan, alarm, light, speaker, or other devices without a logical function.

Figure 6:
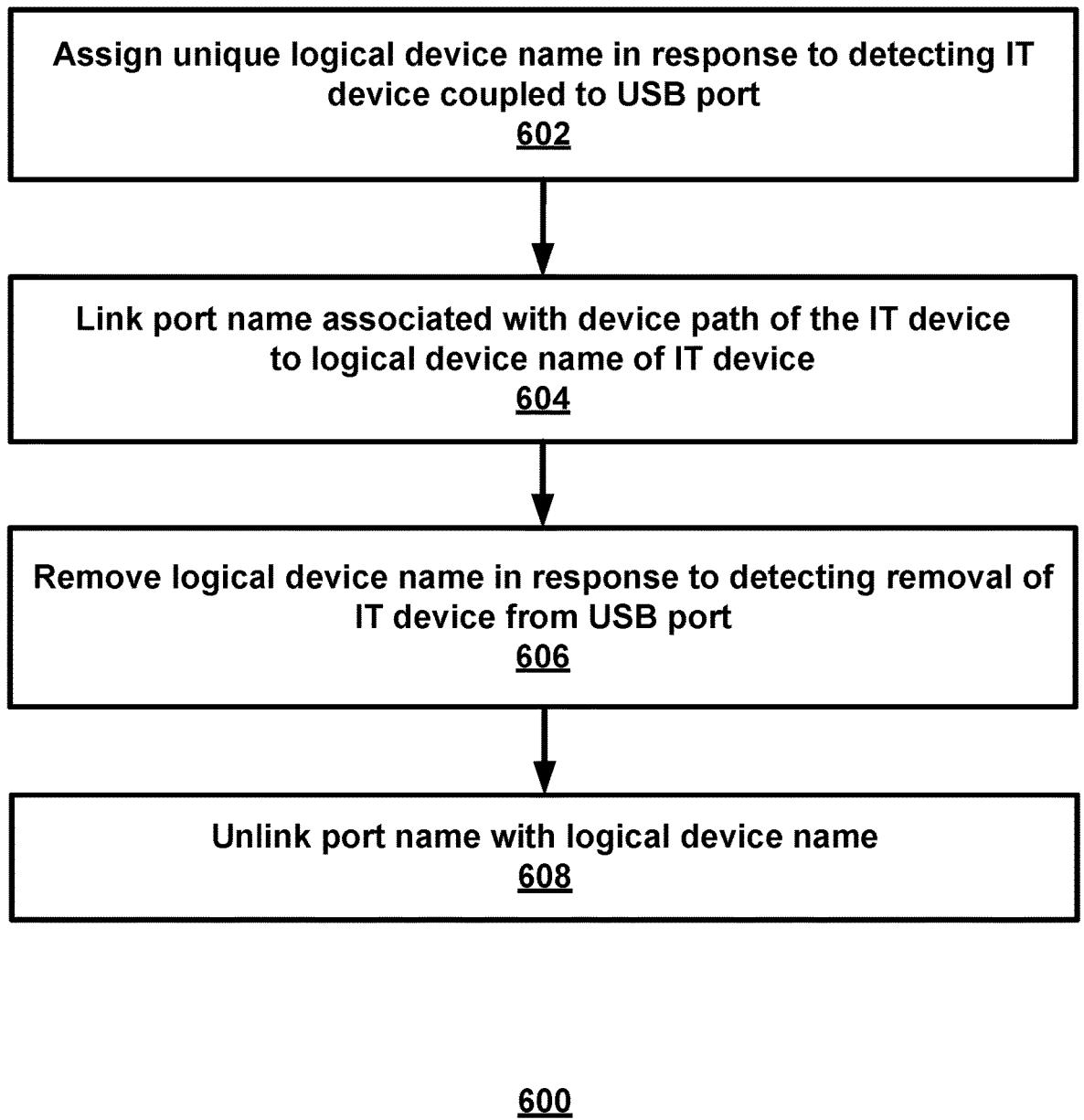
FIG. 6 shows an exemplary method of port mapping.

FIG. 6 shows an exemplary method 600 of port mapping. It should be understood that the steps of the method 600 may be performed in the order shown or a different order. Additional, different, or fewer steps may also be provided. Further, the method 600 may be implemented with the infrastructure management system as illustrated in FIGS. 1-3, the control system 402 as illustrated in FIG. 4, a different system or architecture, or a combination thereof.

At 602, in response to detecting an IT device being communicatively coupled to a USB port 304, device driver 310 assigns a unique logical device name for the IT device. The logical device name may be a deterministic name (e.g., sequential). The logical device name is a string that uniquely identifies the IT device. The logical device name may be stored as, for instance, port mapping information. To prevent potential issues with the OS due to renaming, the original assigned name is stored and a "link" name that identifies the physical port is added to the original assigned name to generate the unique logical device name. For example, the logical device name may be "usbX" (e.g., usb1), wherein X is the incremental device index.

At 604, control application 312 links (or maps) a port name associated with the device path of the IT device to the logical device name of the IT device. This may be performed in response to device driver 310 triggering an "add" event for control application 312. The mapping of the port name to the logical device name may be stored as, for example, port mapping information. Such association may be preserved as long as the internal hardware configuration is preserved. This feature allows a physical port (e.g., USB port) to be mapped internally in the OS to a unique logical device name regardless of the logical position in the device tree 300.

FIG. 7 shows an exemplary table 700. Exemplary table 700 maps the ports shown in columns 702a-b to respective device paths shown in columns 704a-b. The exemplary table 700 may be stored in index or similar data structure as port mapping information. The device path may be represented by a string that identifies where the IT device (e.g., USB device) is connected to the port within the system architecture. In some implementations, the device path indicates the path from the device driver 310 to the particular USB port in the device tree 300 (as illustrated in FIG. 3). For example, the device path for Port 4 is "1.1.1.4". The port (e.g., Port 4) may be associated with a unique port name (e.g., usbPort4). The port name is a string that uniquely identifies the port, and may be made available as a predictable and persistent name to all OS applications.

Returning to FIG. 6, at 606, in response to detecting the IT device is removed from the USB port 304, device driver 310 optionally removes or deletes the unique logical device name for the IT device from port mapping information. Alternatively, the unique logical device name is preserved even after inserting and removing the IT device, allowing the association to be used to map the physical USB port to the IT device. This allows for security enforcement and an association between logical device and the resource. The unique logical device name or the index used to generate the logical device name is not re-used, regardless of whether the logical device name is removed from the port mapping information.

At 608, control application 312 unlinks the port name with the logical device name. The link between the port name and the logical device name may be removed or deleted from the port mapping information in response to device driver 310 triggering a "delete" event for control application 312. OS applications no longer use the removed logical device name.

One example of an IT device that is assigned a unique logical device name is a USB adapter for providing connectivity (e.g. RS232, Ethernet). The configuration for these types of devices relies on a defined reference; otherwise, the configuration may be assigned to the wrong physical adapter, or not assigned at all. For example, the configuration for each of two USB Ethernet adapters addresses a different network. Without a defined logical device name mapped to the exact same physical Ethernet adapter every time, the network configuration may be set on the inverted device, mixing both networks.

Figure 8:
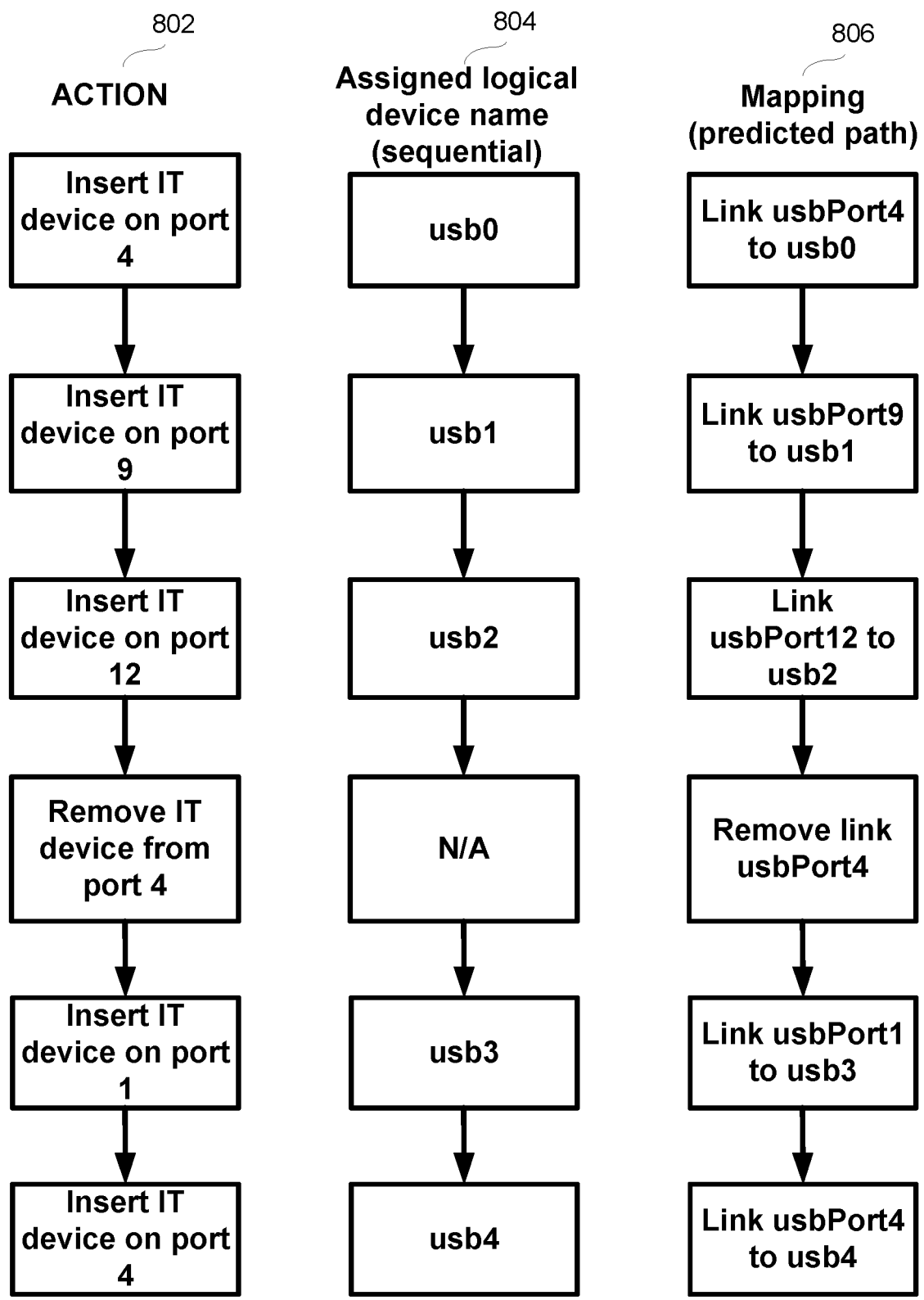
FIG. 8 shows an exemplary sequence of actions.

FIG. 8 shows an exemplary sequence 800 of actions 802, and the associated assignment of logical device names 804 and mapping 806 of the port name with the local device names. For example, when an IT device is inserted in port 4, the unique logical device name "usb0" is assigned to the IT device. The port name "usbPort4" is linked to the logical device name "usb0". As another example, when the IT device is removed from port 4, the link between the port name "usbPort4" and the logical device name "usb0" is removed. As yet another example, when another IT device is inserted in port 4, the logical device name "usb0" is not re-used. Instead, another unique logical name "usb4" is assigned to the IT device. The port name "usbPort4" is then linked to the logical device name "usb4".

Embodiments are operational with numerous other general purpose or special purpose computing system environments or configurations. Examples of well-known computing systems, environments, and/or configurations that may be suitable for use with various embodiments include, but are not limited to, embedded computing systems, personal computers, server computers, hand-held or laptop devices, multiprocessor systems, microprocessor-based systems, set top boxes, programmable consumer electronics, network PCs, minicomputers, mainframe computers, cloud services, telephony systems, distributed computing environments that include any of the above systems or devices, and the like.

Embodiments may be described in the general context of computer-executable instructions, such as program modules, being executed by computing capable devices. Generally, program modules include routines, programs, objects, components, data structures, etc. that perform particular tasks or implement particular abstract data types. Some embodiments may be designed to be practiced in distributed computing environments where tasks are performed by remote processing devices that are linked through a communications network. In a distributed computing environment, program modules may be located in both local and remote computer storage media including memory storage devices.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

In this specification, "a" and "an" and similar phrases are to be interpreted as "at least one" and "one or more." References to "an" embodiment in this disclosure are not necessarily to the same embodiment.

Some embodiments may employ processing hardware. Processing hardware may include one or more processors, computer equipment, embedded systems, machines a combination thereof, and/or the like. The processing hardware may be configured to execute instructions. The instructions may be stored on a machine-readable medium. According to some embodiments, the machine-readable medium (e.g. automated data medium) may be a medium configured to store data in a machine-readable format that may be accessed by an automated sensing device. Examples of machine-readable media include: magnetic disks, cards, tapes, and drums, flash memory, memory cards, electrically erasable programmable read-only memory (EEPROM), solid state drives, optical disks, barcodes, magnetic ink characters, a combination thereof, and/or the like.

While various embodiments have been described above, it should be understood that they have been presented by way of example, and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. Thus, the present embodiments should not be limited by any of the above-described exemplary embodiments. In particular, it should be noted that, for example purposes, the presently described embodiments are discussed with respect to a data center. However, one skilled in the art will recognize that embodiments may be employed to other collections of IT devices over, for example, a distributed network not confined by a single data center, a small collection of IT devices in an Intranet, combinations thereof, and/or the like.

In addition, it should be understood that any figures that highlight any functionality and/or advantages, are presented for example purposes only. The disclosed architecture is sufficiently flexible and configurable, such that it may be utilized in ways other than that shown. For example, the steps listed in any flowchart may be re-ordered or only optionally used in some embodiments.

What is claimed is:

1. A control system, comprising:
   at least one universal serial bus (USB) interface that provides at least one USB port;
   at least one power control unit in communication with the at least one USB interface;
   an information technology (IT) device communicatively coupled to the at least one USB port;
   one or more non-transitory computer-readable media for storing computer-readable program code and a configuration dataset; and
   a processor device in communication with the one or more non-transitory computer-readable media, the at least one power control unit and the at least one USB interface, the processor device is operative with the computer-readable program code to perform operations including
   retrieving configuration data from the configuration dataset,
   controlling power supply to the at least one USB interface in accordance with configuration data of the configuration dataset by enabling or disabling the at least one power control unit,
   assigning a unique logical device name for the information technology (IT) device communicatively coupled to the at least one USB port,
   linking the unique logical device name to a port name associated with a device path of the IT device, detecting the IT device is removed from the at least one USB port, and unlinking the unique logical device name from the port name in response to the detecting the IT device is removed from the at least one USB port; and wherein the at least one power control unit, the one or more non-transitory computer-readable media and the processor device are implemented on a first circuit board disposed on a base plate of a housing of a modular infrastructure management system, wherein, the base plate comprises first and second parallel edges, third and fourth parallel edges which are perpendicular to the first and second parallel edges, first modular slots disposed along at least the first edge of the base plate for removably receiving first communication card modules, wherein the first communication card modules comprise second circuit boards that are parallel to the base plate while the first communication card modules are removably inserted into the first modular slots, and wherein at least two of the first communication card modules comprise different depths.

2. The control system of claim 1 wherein the configuration data comprises power enablement information including power enablement parameters for individual USB ports.

3. The control system of claim 1 wherein the processor device is operative with the computer-readable program code to control power supply to the at least one USB interface by disabling the at least one power control unit and causing the at least one power control unit to disconnect the power supply the USB interface.

4. The control system of claim 1 wherein the processor device is operative with the computer-readable program code to control power supply to the at least one USB interface by enabling the at least one power control unit and causing the at least one power control unit to connect a power source to the at least one USB interface.

5. The control system of claim 1 wherein the configuration data comprises logical device names, port names, mapping of ports to device paths, mapping of port names to ports, mapping of port names to logical device names, or a combination thereof.

6. The control system of claim 1 wherein the device path indicates a path from a USB driver to the USB port in a device tree.

7. The control system of claim 1 wherein the processor device is operative with the computer-readable program code to unlink the unique logical device name from the port name in response to detecting the IT device is removed from the at least one USB port.

8. The control system of claim 1 further comprises second modular slots disposed along the second edge of the base plate for removably receiving at least one second communication card module.

9. The control system of claim 1 wherein the at least one USB interface is implemented on at least one of the first communication card modules.

10. A method for controlling communication by a control system, the method comprises:
providing a control system with
at least one universal serial bus (USB) interface that provides at least one USB port,
at least one power control unit in communication with the at least one USB interface,
an information technology (IT) device communicatively coupled to the at least one USB port,
one or more non-transitory computer-readable media for storing computer-readable program code and a configuration dataset,
a processor device in communication with the one or more non-transitory computer-readable media, the at least one power control unit and the at least one USB interface, the processor device is operative with the computer-readable program code to perform operations including
retrieving configuration data from the configuration dataset,
controlling power supply to the at least one USB interface in accordance with configuration data of the configuration dataset by enabling or disabling the at least one power control unit,
assigning a unique logical device name for the information technology (IT) device communicatively coupled to the at least one USB port,
linking the unique logical device name to a port name associated with a device path of the IT device,
detecting the IT device is removed from the at least one USB port,
unlinking the unique logical device name from the port name in response to the detecting the IT device is removed from the at least one USB port, and wherein the at least one power control unit, the one or more non-transitory computer-readable media and the processor device are implemented on a first circuit board disposed on a base plate of a housing of a modular infrastructure management system, wherein, the base plate comprises first and second parallel edges, third and fourth parallel edges which are perpendicular to the first and second parallel edges, first modular slots disposed along at least the first edge of the base plate for removably receiving first communication card modules, wherein the first communication card modules comprise second circuit boards that are parallel to the base plate while the first communication card modules are removably inserted into the first modular slots, and wherein at least two of the first communication card modules comprise different depths.

11. The method of claim 10 wherein the configuration data comprises power enablement information including power enablement parameters for individual USB ports.

12. The method of claim 10 wherein the processor device is operative with the computer-readable program code to control power supply to the at least one USB interface by disabling the at least one power control unit and causing the at least one power control unit to disconnect the power supply the USB interface.

13. The method of claim 10 wherein the processor device is operative with the computer-readable program code to control power supply to the at least one USB interface by enabling the at least one power control unit and causing the at least one power control unit to connect a power source to the at least one USB interface.

14. The method of claim 10 wherein the configuration data comprises logical device names, port names, mapping of ports to device paths, mapping of port names to ports, mapping of port names to logical device names, or a combination thereof.

15. The method of claim 10 wherein the device path indicates a path from a USB driver to the USB port in a device tree.

16. The method of claim 10 wherein the processor device is operative with the computer-readable program code to unlink the unique logical device name from the port name in response to detecting the IT device is removed from the at least one USB port.

17. The method of claim 10 further comprises second modular slots disposed along the second edge of the base plate for removably receiving at least one second communication card module.

18. The method of claim 10 wherein the at least one USB interface is implemented on at least one of the first communication card modules.

* * * * *